US 12,429,781 B2

(12) United States Patent
Roy (10) Patent No.: US 12,429,781 B2
(45) Date of Patent: Sep. 30, 2025

(54) METROLOGY METHOD AND ASSOCIATED METROLOGY AND LITHOGRAPHIC APPARATUSES

(71) Applicant: ASML NETHERLANDS B.V., Veldhoven (NL)

(72) Inventor: Sarathi Roy, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 145 days.

(21) Appl. No.: 18/012,398

(22) PCT Filed: May 19, 2021

(86) PCT No.: PCT/EP2021/063277
§ 371 (c)(1),
(2) Date: Dec. 22, 2022

(87) PCT Pub. No.: WO2021/259559
PCT Pub. Date: Dec. 30, 2021

(65) Prior Publication Data
US 2023/0259042 A1   Aug. 17, 2023

(30) Foreign Application Priority Data

Jun. 24, 2020   (EP) .................................. 20181954.7

(51) Int. Cl.
*G03F 7/00* (2006.01)
*G01B 11/27* (2006.01)
*G03F 9/00* (2006.01)

(52) U.S. Cl.
CPC ........ *G03F 7/706851* (2023.05); *G01B 11/27* (2013.01); *G03F 7/70633* (2013.01);
(Continued)

(58) Field of Classification Search
CPC ............. G03F 7/70633; G03F 7/70666; G03F 7/706839; G03F 7/706851; G03F 9/7011;
(Continued)

(56) References Cited

U.S. PATENT DOCUMENTS

| 6,961,116 B2 | 11/2005 | Den Boef et al. |
| 7,880,880 B2 | 2/2011 | Van Bilsen et al. |

(Continued)

FOREIGN PATENT DOCUMENTS

| EP | 1744217 | 1/2007 |
| EP | 3477389 | 5/2019 |

(Continued)

OTHER PUBLICATIONS

International Search Report and Written Opinion issued in corresponding PCT Patent Application No. PCT/EP2021/063277, dated Aug. 31, 2021.

*Primary Examiner* — Peter B Kim
(74) *Attorney, Agent, or Firm* — Pillsbury Winthrop Shaw Pittman, LLP (57) ABSTRACT

A method to determine a performance indicator indicative of alignment performance of a processed substrate. The method includes obtaining measurement data including a plurality of measured position values of alignment marks on the substrate and calculating a positional deviation between each measured position value and a respective expected position value. These positional deviations are used to determine a directional derivative between the alignment marks, and the directional derivatives are used to determine at least one directional derivative performance indicator.

20 Claims, 2 Drawing Sheets

(52) U.S. Cl.
CPC .... *G03F 7/70666* (2013.01); *G03F 7/706839* (2023.05); *G03F 9/7011* (2013.01); *G03F 9/7046* (2013.01); *G03F 9/7092* (2013.01)

(58) Field of Classification Search
CPC .... G03F 9/7019; G03F 9/7046; G03F 9/7092; G01B 11/27
See application file for complete search history.

(56) References Cited

U.S. PATENT DOCUMENTS

| | | | |
|---|---|---|---|
| 9,405,204 | B2 | 8/2016 | Huang et al. |
| 2006/0033921 | A1 | 2/2006 | Den Boef et al. |
| 2006/0066855 | A1 | 3/2006 | Den Boef et al. |
| 2009/0195768 | A1 | 8/2009 | Bijnen et al. |
| 2010/0201963 | A1 | 8/2010 | Cramer et al. |
| 2011/0027704 | A1 | 2/2011 | Cramer et al. |
| 2011/0043791 | A1 | 2/2011 | Smilde et al. |
| 2011/0102753 | A1 | 5/2011 | Van De Kerkhof et al. |
| 2011/0317163 | A1* | 12/2011 | Lee ...................... G03F 9/7046 356/401 |
| 2012/0044470 | A1 | 2/2012 | Smilde et al. |
| 2012/0123581 | A1 | 5/2012 | Smilde et al. |
| 2013/0141723 | A1 | 6/2013 | Wei et al. |
| 2013/0258310 | A1 | 10/2013 | Smilde et al. |
| 2013/0271740 | A1 | 10/2013 | Quintanilha |
| 2015/0261097 | A1 | 9/2015 | Mathijssen et al. |
| 2015/0355554 | A1 | 12/2015 | Mathijssen |
| 2019/0094721 | A1 | 3/2019 | Tinnemans et al. |

FOREIGN PATENT DOCUMENTS

| | | |
|---|---|---|
| WO | 2009078708 | 6/2009 |
| WO | 2009106279 | 9/2009 |
| WO | 2013178422 | 12/2013 |
| WO | 2015018625 | 2/2015 |
| WO | 2015049087 | 4/2015 |
| WO | 2015051970 | 4/2015 |
| WO | 2018114152 | 6/2018 |
| WO | P2020057900 | 3/2020 |
| WO | 2021001102 | 1/2021 |

* cited by examiner

METROLOGY METHOD AND ASSOCIATED METROLOGY AND LITHOGRAPHIC APPARATUSES

CROSS-REFERENCE TO RELATED APPLICATIONS

This application is the U.S. national phase entry of PCT patent application no. PCT/EP2021/063277 which was filed on May 19, 2021, which claims priority of European patent application No. 20181954.7 which was filed on Jun. 24, 2020, and which is incorporated herein in its entirety by reference.

FIELD OF INVENTION

The present invention relates to methods and apparatus usable, for example, in the manufacture of devices by lithographic techniques, and to methods of manufacturing devices using lithographic techniques. The invention relates more particularly to metrology sensors and lithography apparatuses having such a metrology sensor.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields".

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down (by the same apparatus or a different lithographic apparatus) in previous layers. For this purpose, the substrate is provided with one or more sets of alignment marks. Each mark is a structure whose position can be measured at a later time using a position sensor, typically an optical position sensor. The lithographic apparatus includes one or more alignment sensors by which positions of marks on a substrate can be measured accurately. Different types of marks and different types of alignment sensors are known from different manufacturers and different products of the same manufacturer.

In other applications, metrology sensors are used for measuring exposed structures on a substrate (either in resist and/or after etch). A fast and non-invasive form of specialized inspection tool is a scatterometer in which a beam of radiation is directed onto a target on the surface of the substrate and properties of the scattered or reflected beam are measured. Examples of known scatterometers include angle-resolved scatterometers of the type described in US2006033921A1 and US2010201963A1. In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

Conventional alignment marks consist of binary phase gratings that diffract incident radiation. They rely on the constructive interference of radiation diffracted by the top of the grating and the bottom of the grating at optimal grating depth. This light is then captured by an alignment sensor and used to define the mark position on the wafer. In the ideal scenario where the alignment marks are perfectly symmetric, assuming no wafer deformation, the Alignment Position Deviation (APD) is zero, resulting in the best overlay. However, as a result of processing, such as etching, chemical-mechanical polishing (CMP), annealing, deposition, oxidation, etc., real alignment marks are deformed in various ways, often resulting in asymmetries, which are not known beforehand. Typical asymmetries observed include Floor Tilt (FT), Top Tilt (TT) and Side Wall Angle (SWA). Furthermore, due to fluctuation in the processing, the depth of alignment marks can also vary around the nominal value.

The result of this may be a wavelength/polarization dependent variation in a measured value from that mark. As such, correction and/or mitigation for this variation is sometimes effected by performing the same measurement using multiple different wavelengths and/or polarizations (or more generally, multiple different illumination conditions). It would be desirable to improve one or more aspects of measuring using multiple illumination conditions.

SUMMARY OF THE INVENTION

The invention in a first aspect provides a method to determine a performance indicator indicative of alignment performance a processed substrate, comprising: obtaining measurement data comprising a plurality of measured position values of alignment marks on said substrate; calculating a positional deviation between each measured position value and a respective expected position value; determining a directional derivative between said alignment marks using said positional deviations; and using said directional derivatives to determine at least one directional derivative performance indicator.

Also disclosed is a metrology apparatus and a lithographic apparatus comprising a metrology device being operable to perform the method of the first aspect.

The above and other aspects of the invention will be understood from a consideration of the examples described below.

BRIEF DESCRIPTION OF THE DRAWINGS

Embodiments of the invention will now be described, by way of example only, with reference to the accompanying drawings, in which.

DETAILED DESCRIPTION OF EMBODIMENTS

Before describing embodiments of the invention in detail, it is instructive to present an example environment in which embodiments of the present invention may be implemented.

Figure 1:
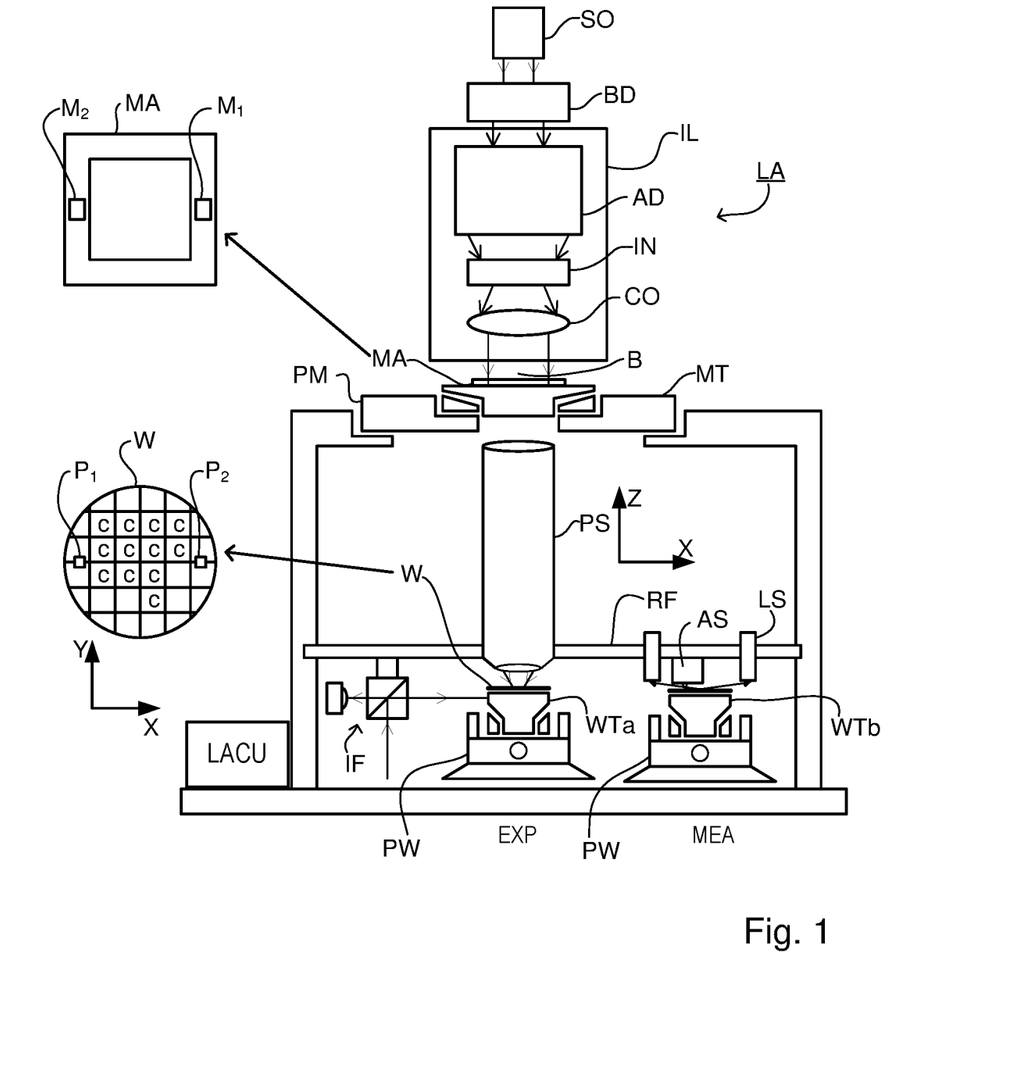
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support MT holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment marks may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
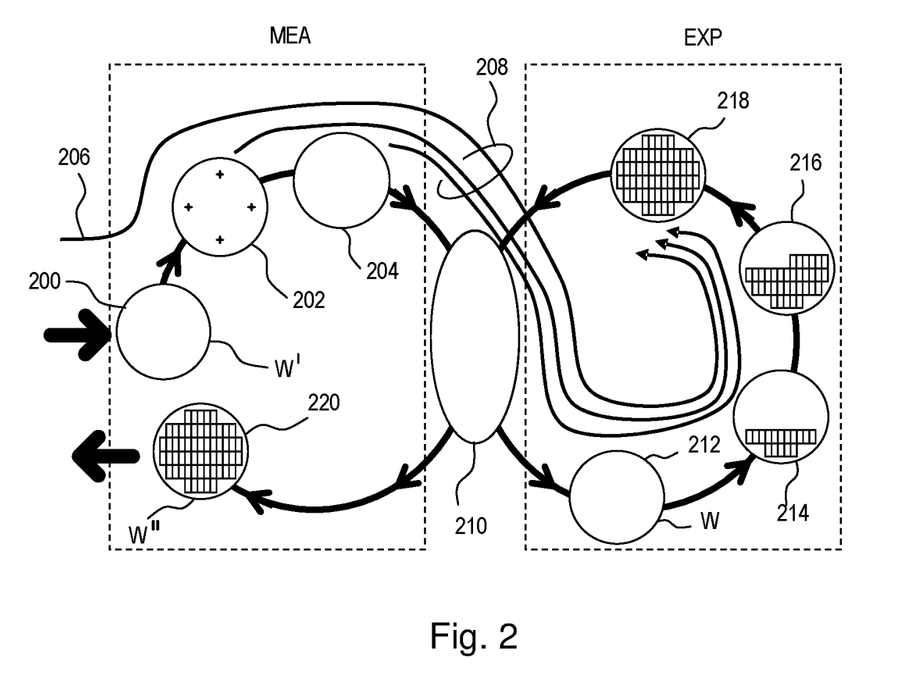
FIG. 2 illustrates schematically measurement and exposure processes in the apparatus of FIG. 1.

FIG. 2 illustrates the steps to expose target portions (e.g. dies) on a substrate W in the dual stage apparatus of FIG. 1. On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one embodiment to establish a "wafer grid", which maps very accurately the distribution of marks across the substrate, including any distortion relative to a nominal rectangular grid.

At step 204, a map of wafer height (Z) against X-Y position is measured also using the level sensor LS. Conventionally, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are used to generate an alignment model with parameters that fit the model to the data. These parameters and the alignment model will be used during the exposure operation to correct positions of patterns applied in the current lithographic step. The model in use interpolates positional deviations between the measured positions. A conventional alignment model might comprise four, five or six parameters, together defining translation, rotation and scaling of the 'ideal' grid, in different dimensions. Advanced models are known that use more parameters.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

The skilled person will know that the above description is a simplified overview of a number of very detailed steps involved in one example of a real manufacturing situation. For example rather than measuring alignment in a single pass, often there will be separate phases of coarse and fine measurement, using the same or different marks. The coarse and/or fine alignment measurement steps can be performed before or after the height measurement, or interleaved.

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down in previous layers (by the same apparatus or a different lithographic apparatus). For this purpose, the substrate is provided with one or more sets of marks. Each mark is a structure whose position can be measured at a later time using a position sensor, typically an optical position sensor. The position sensor may be referred to as "alignment sensor" and marks may be referred to as "alignment marks".

A lithographic apparatus may include one or more (e.g. a plurality of) alignment sensors by which positions of alignment marks provided on a substrate can be measured accurately. Alignment (or position) sensors may use optical phenomena such as diffraction and interference to obtain position information from alignment marks formed on the substrate. An example of an alignment sensor used in current lithographic apparatus is based on a self-referencing interferometer as described in U.S. Pat. No. 6,961,116. Various enhancements and modifications of the position sensor have been developed, for example as disclosed in US2015261097A1. The contents of all of these publications are incorporated herein by reference.

A mark, or alignment mark, may comprise a series of bars formed on or in a layer provided on the substrate or formed (directly) in the substrate. The bars may be regularly spaced and act as grating lines so that the mark can be regarded as a diffraction grating with a well-known spatial period (pitch). Depending on the orientation of these grating lines, a mark may be designed to allow measurement of a position along the X axis, or along the Y axis (which is oriented substantially perpendicular to the X axis). A mark comprising bars that are arranged at +45 degrees and/or −45 degrees with respect to both the X- and Y-axes allows for a combined X- and Y-measurement using techniques as described in US2009/195768A, which is incorporated by reference.

The alignment sensor scans each mark optically with a spot of radiation to obtain a periodically varying signal, such as a sine wave. The phase of this signal is analyzed, to determine the position of the mark and, hence, of the substrate relative to the alignment sensor, which, in turn, is fixated relative to a reference frame of a lithographic apparatus. So-called coarse and fine marks may be provided, related to different (coarse and fine) mark dimensions, so that the alignment sensor can distinguish between different cycles of the periodic signal, as well as the exact position (phase) within a cycle. Marks of different pitches may also be used for this purpose.

Measuring the position of the marks may also provide information on a deformation of the substrate on which the marks are provided, for example in the form of a wafer grid. Deformation of the substrate may occur by, for example, electrostatic clamping of the substrate to the substrate table and/or heating of the substrate when the substrate is exposed to radiation.

Figure 3:
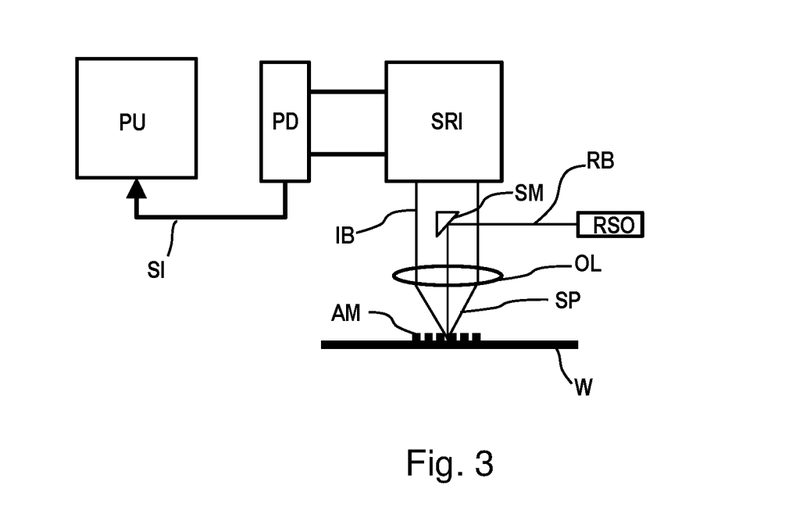
FIG. 3 is a schematic illustration of an alignment sensor adaptable according to an embodiment of the invention.

FIG. 3 is a schematic block diagram of an embodiment of a known alignment sensor AS. Radiation source RSO provides a beam RB of radiation of one or more wavelengths, which is diverted by diverting optics onto a mark, such as mark AM located on substrate W, as an illumination spot SP. In this example the diverting optics comprises a spot mirror SM and an objective lens OL. The illumination spot SP, by which the mark AM is illuminated, may be slightly smaller in diameter than the width of the mark itself.

Radiation diffracted by the mark AM is collimated (in this example via the objective lens OL) into an information-carrying beam IB. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark, so that the information-carrying beam IB comprises only higher order diffracted radiation from the mark AM (this is not essential to the measurement, but improves signal to noise ratios).

Intensity signals SI are supplied to a processing unit PU. By a combination of optical processing in the block SRI and computational processing in the unit PU, values for X- and Y-position on the substrate relative to a reference frame are output.

A single measurement of the type illustrated only fixes the position of the mark within a certain range corresponding to one pitch of the mark. Coarser measurement techniques are used in conjunction with this to identify which period of a sine wave is the one containing the marked position. The same process at coarser and/or finer levels are repeated at different wavelengths for increased accuracy and/or for robust detection of the mark irrespective of the materials from which the mark is made, and materials on and/or below which the mark is provided. Improvements in performing and processing such multiple wavelength measurements are disclosed below.

Another specific type of metrology sensor for which methods herein are applicable, has both alignment and product/process monitoring metrology applications, and is described in WO 2020057900, which is incorporated herein by reference. This describes a metrology device with optimized coherence. More specifically, the metrology device is configured to produce a plurality of spatially incoherent beams of measurement illumination, each of said beams (or both beams of measurement pairs of said beams, each measurement pair corresponding to a measurement direction) having corresponding regions within their cross-section for which the phase relationship between the beams at these regions is known; i.e., there is mutual spatial coherence for the corresponding regions.

When radiation emitted by an alignment sensor interacts with the alignment mark and diffracts, such diffracted radiation comprises information regarding the mark geometry. Therefore, for asymmetric (deformed) alignment marks, the sensor detects a position that differs from the real position on the wafer. This may be referred to as alignment position deviation (APD), which is a measure of the difference of a measured aligned position of a mark and a true aligned position of a mark. This position difference causes overlay errors, which are strongly dependent on the type and magnitude of the asymmetry induced in the mark, and depend also on the mark depth. Contributors to APD comprise, for example:

Grating asymmetry—unwanted grating asymmetry, for example in the form of floor tilt in the bottom grating or unequal side wall angles, cause a wavelength dependent APD. Due to similar length scales, APD varies slowly as a function of wavelength.

Thickness variation and sensor aberrations—Layer thickness variation and interference within a stack can redistribute light within the pupil, which in combination with sensor aberrations causes APD. If, for example, the optical thickness within a stack is in the order of 1 µm, then a typical length scale at which APD varies as a function of wavelength is in the order of 150 nm.

Residual topography and surface roughness—When the wafer quality is low, topography and surface roughness can cause APD, which due to interference, is wavelength dependent. The typical length scale for APD variation is much the same as for layer thickness (e.g., 150 nm for a 1 µm thick stack).

To mitigate this, some alignment sensors measure using multiple different wavelengths (e.g., in respective measurement channels). In an ideal situation, all wavelengths used in a multi-wavelength measurement would produce the same alignment position indications for a mark on a geometrically perfect substrate. However, due to the asymmetries and unwanted mark contributions, this is typically not the case and a wavelength dependent or color-to-color position variation is observed. Methods which enable correction for or mitigation for APD are known, based on multiple wavelength measurements. Some solutions typically attempt to determine the most accurate wavelength for a particular mark/stack and use this. An improved solution, described in more detail in US publication US2019/0094721 A1 (which is incorporated herein by reference), comprises a technique referred to as optimal color weighting (OCW). It should be appreciated that APD scales differently for different colors (e.g. wavelengths or polarizations) as well as depending on layer thickness variations and the type of mark being measured. OCW based methods aim to determine an optimal (e.g., weighted) combination of all the colors used to minimize the impact of mark deformations on a measurement value.

It is desirable to derive a performance measure or performance indicator for verification of how the actual overlay varies with alignment color. Many wafer alignment related performance indicators depend on measured post-exposure measurement data (e.g., overlay data or other reference) to achieve this, since wafer alignment performance indicators cannot themselves always predict the real overlay performance. It would be useful to derive a performance indicator from which a good prediction can be made as to how the overlay will vary for different alignment colors, without the need for overlay data or other post-exposure measurement data (e.g., using only pre-exposure measurement data or alignment data).

A performance indicator presently used is known as the Residual Overlay Performance Indicator (ROPI). ROPI is an indicator used to measure residual wafer grid differences between the process layers and an absolute grid, as defined by the exposure tool stage. More specifically, ROPI may be defined as the 3σ of the wafer residuals (difference) of the measured position versus the modeled positions. While ROPI can be used to predict the overlay color to color behavior, it is not a very accurate measure, and also not always very useful.

An improved performance indicator is therefore proposed which can be determined from alignment data alone, and therefore requires no post-exposure metrology data.

The proposed method may be based on determinations of APD from alignment measurements. Such a performance indicator may comprise a directional derivative performance indicator which depends on local variation.

The directional derivative performance indicator may be calculated by taking the difference in APD values (which are vectors as the position deviation is directional) between the neighboring mark locations and dividing by the distance between them (i.e., taking directional derivatives of the APD over distance). For example, this may be done for each pair of adjacent marks over the wafer (i.e., for each mark with each of its adjacent marks (e.g., per direction). This effectively cancels out similar wafer deformation between neighbors.

For example, for a particular mark at position (x,y) on the wafer, the x (or y) directional derivative may be calculated by taking the difference between this mark and its immediate neighbor in x (or y) direction divided by the distance between the marks. This may be done for each mark, to yield a vector directional derivative at each mark position. The magnitude and phase of this vector can also be calculated (e.g., for each mark). However, it should be appreciated that definitions of neighbors other than an immediate neighbor (either in both directions or a single direction) are possible. Other examples may comprise adding more neighbors to each calculation of a directional derivative. Such an example may comprise taking positive and negative x (or y) directional derivative measurements (e.g., of adjacent marks either side) and averaging over these measurements. As such, the term "neighbor" may include the immediate neighbor (i.e., the closest mark) per direction; or the closest two, three, four, five (or more) marks per direction.

As APD varies with illumination condition (i.e., color, spectrum, bandwidth, polarization or any combination thereof), the directional derivative performance indicator may be determined separately per different illumination condition. The variation of APD with color is due to mark deformation; therefore the proposed directional derivative performance indicator is also a function of color, and thus is indicative of mark deformation.

The directional derivative performance indicator may be determined separately for the X and Y directions, or can be combined from the X and Y components. Depending on the mark type and other measurement parameters, one direction can be more dominant than the other.

Once the directional derivative is determined for a plurality of wafer positions (e.g., for all positions within a wafer), an average or other statistical measure (e.g., mean, median or m+3σ) from these positions may be used to determine a (e.g., single per illumination condition) substrate directional derivative performance indicator value which represents the whole wafer. This directional derivative performance indicator is indicative of alignment quality and therefore expected overlay quality. The directional derivative performance indicators per illumination condition may be compared to each other to determine a preferred illumination condition for a particular target or stack. For example, the alignment values obtained using illumination conditions corresponding to the best directional derivative performance indicator value may be used for exposure, and/or those alignment values corresponding to an illumination condition for which the directional derivative performance indicator was particularly poor may be discarded. A weighting for alignment values for the different illumination conditions may be determined from the per-condition/color directional derivative performance indicators. Such a weighting may be determined similarly to OCW as described in the aforementioned US2019/0094721, for example. Also, if a directional derivative performance indicator value is above a threshold, for example, it may be used to trigger a warning.

As an alternative approach, the directional derivative performance indicator may be used for prediction of overlay (e.g., per illumination condition). For example, the relationship between the directional derivative performance indicator and overlay can be trained. Based on a known set of wafers with corresponding overlay measurement data and directional derivative performance indicators, a scaling factor can be determined using training methods such as a least square optimization or other regression model, or machine learning (e.g., training a neural network or other machine learning model). More specifically, in a training phase, this relationship can be trained based on alignment measurements and the directional derivative performance indicator calculated therefrom and subsequent measured overlay data from one or more training wafers.

Subsequently, the learned relationship or trained model may be used to infer overlay from the directional derivative performance indicator (without overlay data) determined from alignment measurements on a subsequent wafer (i.e., of the same stack or mark). Once determined (per illumination condition), the alignment values corresponding to the illumination condition for which best overlay was predicted may be used for alignment measurements during exposure. Additionally, the derived estimate of overlay variation (in nm) through alignment color may be used to remove or mitigate the dependence of overlay on alignment illumination condition. This may be achieved by subtracting the product of the scaling factor (e.g., as determined during training) and the directional derivative performance indicator from the APD of each color/illumination condition.

To determine APD, the alignment position of each alignment mark after processing may be determined using an alignment system as described above. This alignment position may be compared with an expected alignment position, i.e., the predetermined locations of the alignment marks, in order to determine an alignment position deviation (e.g., associated with a respective measuring color/illumination condition). The alignment position deviation may be determined in two orthogonal directions (X and Y). The result is therefore a (per color) set of alignment position deviations per alignment mark.

It can be shown that an approximately two times improvement may be seen using the proposed directional derivative performance indicator to predict the overlay variation for different alignment colors compared to existing ROPI based directional derivative performance indicators (e.g., using the same training technique). This improvement may be in terms of reduction of 3σ overlay variation through colors (more stable and mark deformation free alignment results in less 3σ variation in overlay).

It should be appreciated that the term color is used throughout this text synonymously with wavelength and the colors may include those outside the visible band (e.g., infrared or ultraviolet wavelengths).

Any mention of marks and alignment marks throughout the specification and claims should be understood to encompass both alignment structures printed for the specific purpose of alignment, other targets suitable for alignment metrology and/or product structures (or any other structures) of a form suitable for alignment metrology.

While specific embodiments of the invention have been described above, it will be appreciated that the invention may be practiced otherwise than as described.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

The breadth and scope of the present invention should not be limited by any of the above-described exemplary embodiments, but should be defined only in accordance with the following claims and their equivalents.

Further embodiments according to the present disclosure are described in the below numbered clauses:

1. A method to determine a performance indicator indicative of alignment performance a processed substrate, comprising:
   obtaining measurement data comprising a plurality of measured position values of alignment marks on said substrate;

calculating a positional deviation between each measured position value and a respective expected position value;

determining a directional derivative between said alignment marks using said positional deviations; and using said directional derivatives to determine at least one directional derivative performance indicator.

2. A method as claimed in clause 1, comprising using only pre-exposure metrology data measured from said alignment marks in said determining at least one directional derivative performance indicator.

3. A method as claimed in clause 1 or 2, wherein said determining a directional derivative comprises determining a difference in said positional deviation values between neighboring alignment marks and dividing by the distance between these neighboring alignment marks.

4. A method as claimed in clause 3, wherein said neighboring alignment marks comprise, for each alignment mark, one or more immediately neighboring marks.

5. A method as claimed in clause 3 or 4, wherein, for each of said marks, a directional derivative is determined for that alignment mark with respect to said one or more immediately neighboring marks.

6. A method as claimed in any preceding clause, wherein said directional derivatives and/or at least one directional derivative performance indicator are determined separately for each of the two perpendicular directions of the substrate plane.

7. A method as claimed in any of clauses 1 to 5, wherein said directional derivatives and/or at least one directional derivative performance indicator are a combined for each of the two perpendicular directions of the substrate plane.

8. A method as claimed in any preceding clause, wherein said at least one directional derivative performance indicator comprises at least one substrate directional derivative performance indicator, wherein each at least one substrate directional derivative performance indicator comprises an average or other statistical measure of said directional derivatives for a particular illumination condition.

9. A method as claimed in any preceding clause, wherein said measurement data comprises measured position values for a plurality of illumination conditions and said at least one directional derivative performance indicator comprises a different directional derivative performance indicator for each of said illumination conditions.

10. A method as claimed in clause 9, comprising comparing each of said directional derivative performance indicators to determine a preferred illumination condition for a particular target or stack.

11. A method as claimed in clause 9 or 10, comprising selecting measured position values corresponding to one or more illumination conditions for which the directional derivative performance indicator indicates best alignment performance and/or acceptable alignment performance above a threshold, for positioning said substrate in an exposure.

12. A method as claimed in clause 9, 10 or 11, comprising discarding measured position values corresponding to one or more illumination conditions for which the directional derivative performance indicator indicates poor alignment performance below a threshold, for positioning said substrate in an exposure.

13. A method as claimed in any of clauses 9 to 12, comprising determining a weighting for measured position values for the different illumination conditions from said different directional derivative performance indicator for each of said illumination conditions.

14. A method as claimed in any of clauses 9 to 13, comprising a step of predicting an overlay metric from said at least one directional derivative performance indicator.

15. A method as claimed in clause 14, wherein the step of predicting an overlay metric comprises using a trained model or relationship able to predict overlay from said at least one directional derivative performance indicator.

16. A method as claimed in clause 15 comprising using this relationship or trained model and the directional derivative performance indicator for each measurement condition to determine a correction for each measured position value so as to remove or mitigate the dependence of overlay on measurement condition.

17. A method as claimed in clause 16, wherein said relationship comprises a scaling factor and said method comprises subtracting the product of the scaling factor and the directional derivative performance indicator for from the position deviation, for each illumination condition.

18. A method as claimed in any of clauses 15 to 17, comprising selecting measured position values corresponding to the illumination condition for which best overlay performance is predicted, for positioning said substrate in an exposure.

19. A method as claimed in any of clauses 15 to 18, comprising an initial training step to train the model or relationship based on the directional derivative performance indicator determined on one or more training substrates and subsequent measured overlay data.

20. A computer program comprising program instructions operable to perform the method of any of any preceding clause, when run on a suitable apparatus.

21. A non-transient computer program carrier comprising the computer program of clause 20.

22. A processing arrangement comprising:
the non-transient computer program carrier of clause 21; and
a processor operable to run the computer program comprised on said non-transient computer program carrier.

23. A lithographic apparatus comprising:
an alignment sensor;
a patterning device support for supporting a patterning device;
a substrate support for supporting a substrate; and
the processing arrangement of clause 22.

24. A lithographic apparatus as claimed in clause 23, wherein the alignment sensor is operable to measure the substrate to obtain said measurement data using a plurality of different illumination conditions.

25. A lithographic apparatus as claimed in clause 23 or 24, wherein the processing arrangement is further operable to select measured position values corresponding to a subset of said illumination conditions, for control said patterning device and/or substrate support at least one directional derivative performance indicator.

26. An alignment apparatus comprising the processing arrangement of clause 22.

The invention claimed is:

1. A method to determine a performance indicator indicative of alignment performance of a processed substrate, the method comprising:

obtaining measurement data comprising a plurality of measured position values of alignment marks on the substrate;

calculating a positional deviation between each measured position value and a respective expected position value;

determining a directional derivative between the alignment marks using the positional deviations, the directional derivative representing a change of the positional deviations per unit distance; and using the directional derivative to determine at least one directional derivative performance indicator.

2. The method as claimed in claim 1, comprising using only pre-exposure metrology data measured from the alignment marks in the determining at least one directional derivative performance indicator.

3. The method as claimed in claim 1, wherein the determining a directional derivative comprises determining a difference in the positional deviation values between neighboring alignment marks and dividing by the distance between these neighboring alignment marks.

4. The method as claimed in claim 1, wherein the directional derivative and/or at least one directional derivative performance indicator is determined separately for each of two perpendicular directions of a substrate plane.

5. The method as claimed in claim 1, wherein the at least one directional derivative performance indicator comprises at least one substrate directional derivative performance indicator, wherein each at least one substrate directional derivative performance indicator comprises an average or other statistical measure of the directional derivative for a particular illumination condition.

6. The method as claimed in claim 1, wherein the measurement data comprises measured position values for a plurality of illumination conditions and the at least one directional derivative performance indicator comprises a different directional derivative performance indicator for each of the illumination conditions.

7. The method as claimed in claim 6, further comprising comparing each of the directional derivative performance indicators to determine a preferred illumination condition for a particular target or stack.

8. The method as claimed in claim 6, further comprising selecting measured position values corresponding to one or more illumination conditions for which the directional derivative performance indicator indicates best alignment performance and/or acceptable alignment performance above a threshold, for positioning the substrate in an exposure.

9. The method as claimed in claim 6, further comprising determining a weighting for measured position values for the different illumination conditions from the different directional derivative performance indicator for each of the illumination conditions.

10. The method as claimed in claim 6, further comprising predicting an overlay metric from the at least one directional derivative performance indicator.

11. The method as claimed in claim 10, wherein the predicting an overlay metric comprises using a trained model or relationship able to predict overlay from the at least one directional derivative performance indicator.

12. A non-transient computer program carrier comprising a computer program therein, the computer program, upon execution by an apparatus, configured to cause the apparatus to at least:

obtain measurement data comprising a plurality of measured position values of alignment marks on a substrate;

calculate a positional deviation between each measured position value and a respective expected position value;

determine a directional derivative between the alignment marks using the positional deviations, the directional derivative representing a rate of change of the positional deviations per unit distance; and use the directional derivative to determine at least one directional derivative performance indicator indicative of alignment performance.

13. A processing arrangement comprising:

the non-transient computer program carrier of claim 12; and a processor operable to run the computer program comprised on the non-transient computer program carrier.

14. A lithographic apparatus comprising:

an alignment sensor;

a patterning device support configured to support a patterning device;

a substrate support configured to support a substrate; and the processing arrangement of claim 13.

15. An alignment apparatus comprising the processing arrangement of claim 13.

16. The carrier of claim 12, wherein the computer program, upon execution by the apparatus, is further configured to cause the apparatus to determine a directional derivative by determination of a difference in the positional deviation values between neighboring alignment marks and dividing by the distance between these neighboring alignment marks.

17. The carrier of claim 12, wherein the directional derivative and/or at least one directional derivative performance indicator is are determined separately for each of two perpendicular directions of a substrate plane.

18. The carrier of claim 12, wherein the at least one directional derivative performance indicator comprises at least one substrate directional derivative performance indicator, wherein each at least one substrate directional derivative performance indicator comprises an average or other statistical measure of the directional derivative for a particular illumination condition.

19. The carrier of claim 12, wherein the measurement data comprises measured position values for a plurality of illumination conditions and the at least one directional derivative performance indicator comprises a different directional derivative performance indicator for each of the illumination conditions.

20. The carrier of claim 19, wherein the computer program, upon execution by the apparatus, is further configured to cause the apparatus to compare each of the directional derivative performance indicators to determine a preferred illumination condition for a particular target or stack.

* * * * *